(12) United States Patent
Inoue et al.

(10) Patent No.: US 7,485,372 B2
(45) Date of Patent: Feb. 3, 2009

(54) MULTI-LAYER COATING HAVING EXCELLENT ADHESION AND SLIDING PROPERTIES AND PRODUCTION METHOD THEREOF

(75) Inventors: Ken Inoue, Yonago (JP); Kenichi Inoue, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 299 days.

(21) Appl. No.: 11/375,255

(22) Filed: Mar. 15, 2006

(65) Prior Publication Data

US 2006/0234081 A1 Oct. 19, 2006

(30) Foreign Application Priority Data

Apr. 13, 2005 (JP) .............................. 2005-116098

(51) Int. Cl.
*B21J 13/02* (2006.01)
*C23C 14/00* (2006.01)

(52) U.S. Cl. .............. 428/472; 204/192.11; 204/192.15; 204/192.16; 204/298.04; 204/298.05; 428/216; 428/336; 428/469; 428/697; 428/698; 428/699; 428/704

(58) Field of Classification Search ................. 428/336, 428/697, 698, 699, 701, 704, 216, 469, 472; 204/192.11, 192.15, 192.16, 298.04, 298.05
See application file for complete search history.

(56) References Cited

U.S. PATENT DOCUMENTS 5,709,936 A * 1/1998 Besmann et al. ............ 428/698

5,965,253 A 10/1999 Roehberger et al.

(Continued)

FOREIGN PATENT DOCUMENTS

EP 0 558 061 A1 9/1993

(Continued)

OTHER PUBLICATIONS

Fox V.C. et al.: "The Structure of tribologically improved MoS2-metal composite coatings and their industrial applications" Surface and Coatings Technology Elsevier Switzerland, vol. 116-119, Sep. 1999, pp. 492-497, XP0022384248.

(Continued)

*Primary Examiner*—Archene Turner
(74) *Attorney, Agent, or Firm*—Sughrue Mion, PLLC

(57) ABSTRACT

It is an object of the present invention to provide a multi-layer coating having excellent adhesion and sliding properties, which contains a hard layer having a main component of a nitride and/or carbonitride containing one or more elements selected from the group consisting of Ti, V, Zr, Cr, Nb, Si, Al and B and a lubricating layer consisting of a metal element and molybdenum disulfide on the hard layer wherein the lubricating layer has a graded composition in which the metal element has a decreasing content from the hard layer side towards the surface and the molybdenum disulfide has an increasing content, and wherein the lubricating layer has a maximum oxygen concentration of no greater than 25 atom %.

20 Claims, 2 Drawing Sheets

U.S. PATENT DOCUMENTS

| | | | |
|---|---|---|---|
| 6,423,419 B1 | 7/2002 | Teer et al. | |
| 6,521,349 B1 * | 2/2003 | Konig et al. | 428/336 |
| 6,528,171 B1 | 3/2003 | Endler et al. | |
| 7,147,939 B2 * | 12/2006 | Henderer et al. | 428/704 |

FOREIGN PATENT DOCUMENTS

| | | |
|---|---|---|
| EP | 1245699 A2 | 10/2002 |
| JP | 061-255998 | 11/1986 |
| JP | 07-268620 | 10/1995 |
| JP | 2000-001768 | 1/2000 |
| WO | WO 97/04142 | 2/1997 |
| WO | WO 99/55930 | 11/1999 |

OTHER PUBLICATIONS

Rigato V et al.: "Properties of sputter-deposited MoS2/metal composite coatings deposited by closed field unbalanced magnetron sputter ion plating" Surface and Coatings Technology Elsevier Switzerland, vol. 131, No. 1-3, Sep. 1, 2000, pp. 206-210, XP002391415.

Wang D Y et al. "Microstructural and tribological characterization of MoS2-Ti composite solid lubricating films" Surface and Coatings Technology Elsevier Switzerland, vol. 120-121, Nov. 1999, pp. 629-635, XP002384249.

* cited by examiner

1. CHAMBER
2. MOLYBDENUM DISULFIDE SPUTTERING SOURCE
3. METAL ELEMENT GENERATING SOURCE
4. OBJECT TO BE TREATED ic vapor deposition (PVD) or chemical vapor deposition (CVD). Substances such as molybdenum disulfide and diamond-like carbon (DLC) are already being put to practical use.

MULTI-LAYER COATING HAVING EXCELLENT ADHESION AND SLIDING PROPERTIES AND PRODUCTION METHOD THEREOF

BACKGROUND OF THE INVENTION

The present invention relates to a multi-layer coating having excellent adhesion and sliding properties, and production method thereof, which can be applied onto a part surface of tools or similar items, such as a metal die, that are used, for example, in environments ranging from hot to cold.

The development of solid lubricants has mainly proceeded for intended use in environments wherein lubricating oil could not be easily employed, such as high temperature, extreme low temperature, ultra high pressure, a vacuum and the like. Among such solid lubricants, there are those which can be applied to parts having a complex shape by being deposited as a coating onto the object to be treated by a process such as physical vapor deposition (PVD) or chemical vapor deposition (CVD). Substances such as molybdenum disulfide and diamond-like carbon (DLC) are already being put to practical use.

Of these, molybdenum disulfide is being applied to many sliding parts to improve seize resistance, due to its superior sliding properties and the fact that it can maintain a low friction coefficient even in an air atmosphere of up to several hundred ° C. In particular, by depositing molybdenum disulfide onto a hard layer such as a nitride or a carbonitride which have excellent wear resistance, a multi-layer coating having excellent sliding properties can be produced which has wear resistance and seize resistance at the same time. A method has also been proposed which improves the adhesion and weatherability of a coating by incorporating a metal element into the molybdenum disulfide (JP-A-2000-001768).

However, molybdenum disulfide has the drawback of being an extremely soft substance, which when formed into a coating does not always possess sufficient adhesion with the object to be treated. For this reason, if a molybdenum disulfide coating is applied as is onto a sliding part, there is the serious problem that the coating is susceptible at an initial stage of use to peeling and thereby lost without exhibiting sufficient performance. In addition, molybdenum disulfide also has the drawback that it is highly hygroscopic, which causes lubricating performance to deteriorate.

The above-mentioned JP-A-2000-001768 describes measures against such problems. Namely, because molybdenum disulfide hardens if incorporated with a metal element, adhesion with a part will certainly improve when formed into a coating. However, not only is this adhesive strength not strong enough to be applied to a part which is subject to vigorous sliding, if the ratio of the metal element is too high the excellent lubricating properties that an inherent characteristic of molybdenum disulfide deteriorates. Further, not only are the excellent lubricating properties of molybdenum disulfide affected by moisture in the atmosphere, but the molybdenum disulfide properties cannot be said to be adequate for utilization merely with the measures disclosed in JP-A-2000-001768.

It is an object of the present invention to provide a multi-layer coating having excellent adhesion and sliding properties, and production method thereof, by improving on conventional molybdenum disulfide lubricating layers.

As a result of detailed experimentation and investigation relating to molybdenum disulfide layer carried out by the present inventors, the present inventors realized that if, for example, a nitride, carbonitride or other such compound to serve as a hard layer is formed under the molybdenum disulfide layer, which is a sulfide, sufficient adhesion cannot be achieved because the material properties (constituent elements, interatomic bonds, crystal structure etc.) of these layers are substantially different. Further investigation based on this perspective showed that in order to increase the adhesion of a molybdenum disulfide layer, it is preferable to increase the ratio of the metal element in the layer. This investigation also showed that adhesion and sliding properties can both be sufficiently attained in the same layer by gradiently varying the ratio of the metal element in the layer.

Moreover, the present inventors showed that the factors influencing the sliding properties of a coating do not only relate to humidity, which had been pointed out in the past, and that oxygen impurities in the layer also have a large influence, thereby arriving at their proposal for an optimal production method for resolving the problems.

SUMMARY OF THE INVENTION

That is, the present invention is a multi-layer coating having excellent adhesion and sliding properties, which comprises a lubricating layer consisting of a metal element and molybdenum disulfide on a hard layer whose main component is a nitride and/or carbonitride comprising one or more elements selected from the group consisting of Ti, V, Zr, Cr, Nb, Si, Al and B, wherein the composition of the lubricating layer is a gradient in which a ratio of the metal element decreases, and a ratio of the molybdenum disulfide increases, going towards the surface from the hard layer side, and wherein a maximum oxygen concentration of the lubricating layer is no greater than 25 atom %. In such a multi-layer coating, the metal element constituting the lubricating layer is preferably Ti. In addition, a 0.01 μm or more thick molybdenum disulfide layer is preferably formed on the top surface of the multi-layer coating.

The present invention further provides a method for producing a multi-layer coating having excellent adhesion and sliding properties, wherein in forming the multi-layer coating, an ion plating source is used for forming the hard layer, a coating source is used for forming the lubricating layer, and at least the molybdenum disulfide contained therein is deposited using a sputtering source, the ion plating source and the coating source being provided in the same chamber, wherein an object held in the chamber, which is to have the multi-layer coating formed thereon is provided with the hard layer formed at a temperature of 380° C. or more and subsequently the lubricating layer formed while the object is held in the chamber. The temperature of the object to be treated when forming the lubricating layer is preferably no greater than 380° C. The ion plating source is preferably an arc discharge type. In addition, the sputtering source for depositing the molybdenum disulfide preferable either applies a direct current pulse voltage, or is an unbalanced magnetron sputtering source.

By capitalizing on conventional molybdenum disulfide lubricant action, the present invention enables a multi-layer coating having even more excellent adhesion and sliding properties, and production method thereof, to be provided.

DETAILED DESCRIPTION OF THE INVENTION

Figure 1:
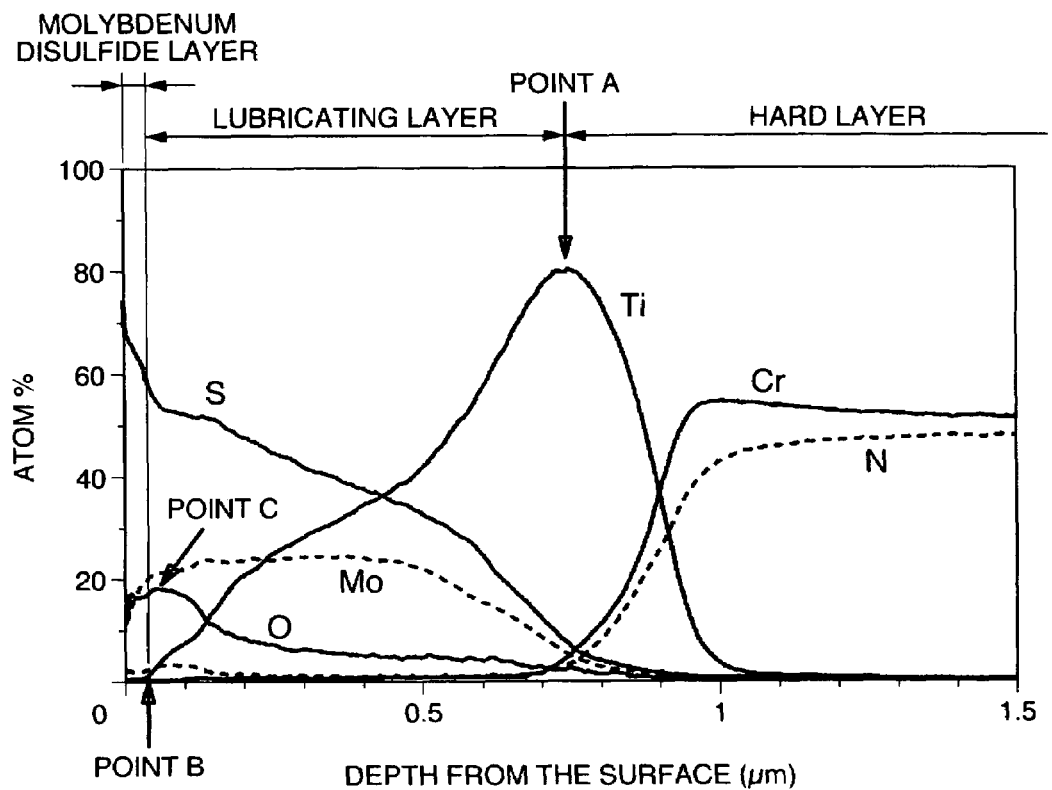
FIG. 1 is a view analyzing one example of a multi-layer coating according to the present invention in a coating thickness direction by glow discharge emission spectral analysis (GDS)

One characteristic of the present invention lies in that the factors for insufficient adhesion in a conventional lubricating coating which utilizes a sulfide are clarified. Specifically, when forming a hard layer of carbonitride or the like as an underlayer, the adhesion insufficiency of a molybdenum disulfide layer formed thereabove can be resolved through the reexamination and control of the coating structure across both the layers.

Another characteristic of the present invention lies in the clarification of the factors behind deterioration in sliding properties that were a problem for conventional lubricating coating which utilized a sulfide. Specifically, in addition to the above-described control of the coating structure, by reexamining the constituents contained in the additionally formed molybdenum disulfide layer (lubricating layer), the inadequacy in sliding properties (seize resistance) can also be resolved.

The present invention is directed to a multi-layer coating that has excellent sliding properties. These properties are realized by coating a substance, which has even better seize resistance and which exhibits a low friction coefficient, so that it adheres well onto a hard layer which is wear resistant. At this stage it is important that the hard layer which will serve as the underlayer has a nitride and/or carbonitride as a main component that is a high-hardness substance having a Vickers hardness of 1,000 HV or more for handling wear resistance. Representative examples of such substances that are often industrially employed include nitrides and carbonitrides comprising one or more elements selected from the group consisting of Ti, V, Zr, Cr, Nb, Si, Al and B.

Here, the term "main component" means that compounds other than the nitride and/or carbonitride are not excessively present in the hard layer. For example, if oxides or other such compounds are excessively present, the wear resistance which is so important for the hard layer properties according to the present invention deteriorates. Thus, this term is used to mean that the other compounds should be present in such a small amount that does not adversely affect the hard coating. This amount may be such that peaks other than the main component nitride or carbonitride cannot be confirmed by analysis such as X-ray diffraction, for example. However, there are no barriers to incorporating into the hard coating elements other than the Ti and other elements listed above, as long as the incorporated amount is within the range in which the above-described excessive amount of the compounds is not formed. Examples of such elements include O, Hf, Ta, Y and the like.

In terms of low friction properties and thermal stability, molybdenum disulfide is the most suitable for the lubricating layer formed on the hard layer. However, as stated above, molybdenum disulfide is a soft substance, and when made into a layer has the problem that adhesion is poor. Therefore, to improve the adhesion of molybdenum disulfide it is effective to increase the hardness of molybdenum disulfide. One such technique is to incorporate a metal element into the molybdenum disulfide.

However, if a metal element is incorporated into molybdenum disulfide, the layer friction properties are worse than those for pure molybdenum disulfide. Thus, as a method to maintain excellent friction properties while exhibiting high adhesion, it is effective to form the layer so as to manifest a gradient composition, wherein the composition of the lubricating layer has a ratio of molybdenum disulfide which increases and a ratio of metal element which decreases going from the hard layer side towards the surface. The term "gradient composition" as used here is defined as the "continuous (or as described below, step-wise) increase or decrease of the chemical composition in a thickness direction". A gradient structure of such a composition can be identified by, for example, glow discharge emission spectral analysis (GDS). GDS not only is highly accurate, but has a fast analysis speed, which make it a suitable technique for coating analysis of a thickness of about a few µm. An example of the analyzed results is shown in FIG. 1.

Before explaining the gradient composition of the above-described lubricating layer, the entire multi-layer coating according to the present invention will be explained. In GDS, the analyzed object area is approximately a few mm$^2$, which is too broad for the coating thickness of the present invention. Thus, as can be seen in FIG. 1, the layer boundaries do not clearly appear. However, as a consequence, there are no problems in defining the boundary (point A) between the hard layer and the lubricating layer as "the layer thickness site at which the amount of metal (Ti in FIG. 1) constituting the lubricating layer exhibits a peak". The effects of the present invention at such point are sufficiently attained, and are reproducible.

According to the above definition, the region to the right of point A is the hard layer. As a result, it can be considered that the metal (Ti in FIG. 1) increasing from 0 atom % is present on the surface side of such region, although this is not related to the gist of the present invention. The composition of the hard layer can be evaluated at any depth which lack the above-described metal. The hard layer in the case of FIG. 1 consists of CrN.

Further, in FIG. 1, the top surface layer comprising the molybdenum disulfide monolayer, which will be described later, has an interface with the lubricating layer, which may be defined as the "depth where the metal element of the lubricating layer disappears" (point B).

The lubricating layer will now be explained. In FIG. 1 it can be seen that the contained metal Ti content continuously decreases going from point A, which is the lubricating layer start point, towards the surface, while the S content which makes up the molybdenum disulfide continuously increases, thereby achieving the gradient composition according to the present invention. The gradient composition according to the present invention can preferably be quantitatively defined by the metal content curve for which a clear content profile can be easily obtained. That is, with the horizontal axis representing distance from the surface (units: µm) and the vertical axis representing content (units: atom %), a preferable state is where the gradient between two points separated by a distance of 0.2 µm at any section of the metal content curve in the lubricating layer region (between points A and B) is never less than 20, and, similarly, the gradient between two points separated by a distance of 0.05 µm is never greater than 350. It can be seen that in FIG. 1 the decreasing profile of the Ti in the lubricating layer satisfies these defined values.

Another essential characteristic for the multi-layer coating according to the present invention is the stipulation of the oxygen concentration in the lubricating layer. This is stipulated because the frictional properties of molybdenum disulfide are largely dependent on the contained oxygen concentration, and not just on the contained moisture. If the oxygen concentration is large, the inherent excellent seize resistance is not sufficiently exhibited. In order for the layer according to the present invention to express sufficient sliding properties, the oxygen concentration detected in the layer thickness direction of the lubricating layer must not exceed a maximum of 25 atom %. Preferably, the concentration does not exceed 20 atom %, and more preferably does not exceed 18 atom %. If the oxygen concentration does exceed 25 atom %, the lubricating layer becomes brittle, whereby peeling can easily occur. The oxygen concentration can be determined by GDS analysis. In FIG. 1 the maximum oxygen concentration is 18 atom % (point C).

In the present invention, there are no particular stipulations on the metal element content in the lubricating layer. However, since the greater the metal element content directly above the hard layer is, the better layer adhesion is, the metal element content at the interface between the hard layer and the lubricating layer preferably has at least 60 atom %. More preferable is 70 atom % or more (including essentially 100 atom %). In FIG. 1, a Ti amount of 80 atom % can be read (point A). On the other hand, at the surface of the lubricating layer, since the lower the metal element content is, the more easily the excellent lubricating properties of molybdenum disulfide are expressed, the metal element content at the surface is preferably no greater than 10 atom %, and more preferably no greater than 5 atom %. It can be noted that, further above that layer, the metal element Ti was not found in the below-described molybdenum disulfide monolayer forming the multi-layer coating illustrated in FIG. 1.

While Ti was used as an example when explaining the metal element species which along with molybdenum disulfide forms the lubricating layer, this does not particularly limit the elemental species as regards the effect for securing adhesion with the hard layer of the underlayer. It has been confirmed that when one or more of Ti, V, Zr and Cr are selected, good layer adhesion and sufficient sliding properties can be attained. Of these, it has been confirmed that Ti can achieve the most stable adhesion and sliding properties.

The above-described metal element, which along with molybdenum disulfide constitutes the lubricating layer, is added for the purpose of improving layer adhesion. From the perspective of the inherent lubricating properties, it would be preferable if the metal element was not present. Although a pure molybdenum disulfide layer is susceptible to abrasion from sliding, such a pure layer exhibits an effect of adapting the parts together at the initial stage of sliding. For this purpose the molybdenum disulfide layer at the top surface is preferably present in a thickness of 0.01 µm or more. Although there are no upper limits stipulated for the thickness, because there is the risk that layer adhesion will deteriorate if formed with a more than necessary thickness, an upper limit can be set at about 0.2 µm.

Next, points regarding a preferable method stipulated by the present invention for the production of the above-described multi-layer coating will be described.

The multi-layer coating according to the present invention is constituted from layers having differing natures, wherein a hard layer handles wear resistance and a lubricating layer handles seize resistance. Therefore, although the use of different methods could be thought of for the formation of the respective layers, the present invention generally contemplates PVD.

Representative PVD methods include ion plating and sputtering. An ion plating method comprises a step whose major purpose is the vaporization and ionization of a target substance, which is the ion plating source, during the deposition process. Sputtering, on the other hand, comprises a step whose major purpose is to sputter the target substance in the sputtering source by irradiation of ions or the like during the deposition process. Both of these methods possess their own characteristics, although it is easier in ion plating to form various hard layers having good adhesion by selecting the target substance and atmospheric gas. On the other hand, in sputtering a molybdenum disulfide layer or similar can be easily formed with a high degree of freedom in substance selection.

Usually these types of PVD apparatus are provided with chambers that are separate from each other, so that when trying to form a multi-layer coating as in the present invention, two batch treatments are necessary. This means that after the hard layer has been formed, the object in process is brought out once into the air atmosphere, which may contaminate its surface by oxidation, and adversely affect adhesion of the lubricating layer formed thereafter. However, for a composite PVD apparatus in which the ion plating source and the sputtering source are incorporated with each other to form the same chamber, a lubricating layer can be formed by first forming the hard layer according to the present invention by ion plating, and then, without taking the object to be treated out of the apparatus, by subsequently activating the sputtering source with the object to be treated kept in the chamber as is, whereby a multi-layer coating can be formed by just one batch treatment.

Using the composite PVD apparatus according to the present invention means that the process is straightforward and also dramatically increases productivity. However, the main advantage of such an apparatus lies in the following two points. The first advantage is that, as described above, because the object to be treated is not brought out into the air after the hard layer has been formed by ion plating, the surface (i.e. lubricating layer surface) is not subject to oxidation contamination, and can thus be kept clean.

The second advantage lies in the improved degree of cleanliness of the lubricating layer itself. In the layers according to the present invention it is necessary for the contained oxygen concentration to be no greater than 25 atom % in order for the lubricating layer to exhibit good adhesion. However, if a layer contains a large amount of molybdenum disulfide, it is difficult to attain the above-described oxygen concentration level if a sputtering dedicated apparatus is used only for the purpose of forming the present layer. That is, because molybdenum disulfide is itself extremely susceptible to oxidation and is highly hygroscopic, the chamber interior is contaminated when opened up to the air as a result of molybdenum disulfide which has adhered to the chamber during repeated operation, which will impact on the degree of cleanliness of the subsequent lubricating layers.

Therefore, for a composite PVD apparatus having the ion plating source and the sputtering source in the same chamber, even should the chamber interior be contaminated by molybdenum disulfide deposition from a prior batch, the chamber interior turns into an active atmosphere at the next batch from the activation of the ion plating source, thereby promoting deoxygenation, whereby the chamber interior is cleaned. Thus, such an apparatus exhibits these effects only because in the formation of a multi-layer coating according to the present invention a hard layer forming step by ion plating must be performed during the lubricating layer forming process.

In addition to this, if the above-described composite PVD apparatus is utilized in the formation of a multi-layer coating according to the present invention, prior to the formation of the lubricating layer the chamber interior surface is coated with the hard layer, whereby the contamination by molybdenum disulfide accumulated in the prior batch is removed additionally. Because of this action, the use of a composite PVD apparatus is extremely effective in lowering the oxygen concentration in the lubricating layer constituting the multi-layer coating according to the present invention, and is therefore an essential requirement.

To sufficiently reduce the oxygen concentration of the lubricating layer, in addition to using a composite PVD apparatus, it is necessary to conduct the hard layer deposition at no less than 380° C. Doing so further promotes degassing of the chamber interior, whereby the 25 atom % or less oxygen level in the lubricating layer that is necessary for a sliding part can be achieved. Preferably the temperature is no less than 400° C. While there are no particular limits on the how high the temperature can be, if the deposition temperature is too high the residual compression stress in the hard layer decreases, whereby the required wear resistance necessary as a hard layer deteriorates. Therefore, deposition is preferably carried out in a range of 550° C. or less, and the range between 420° C. and 500° C. is more preferable.

The multi-layer coating according to the present invention is characterized in gradiently varying the composition of the molybdenum disulfide and the metal element in the lubricating layer. However, to form this layer the generating sources for the molybdenum disulfide and metal element coating are separate, which requires the generating source outputs to each be continuously varied during the lubricating layer formation. Although the molybdenum disulfide deposition must be carried out by a sputtering source, the metal element generating source can be either an ion plating source or a sputtering source. However, from the perspective of easily varying the continuous output, the metal element generating source is preferably also a sputtering source.

Figure 2:
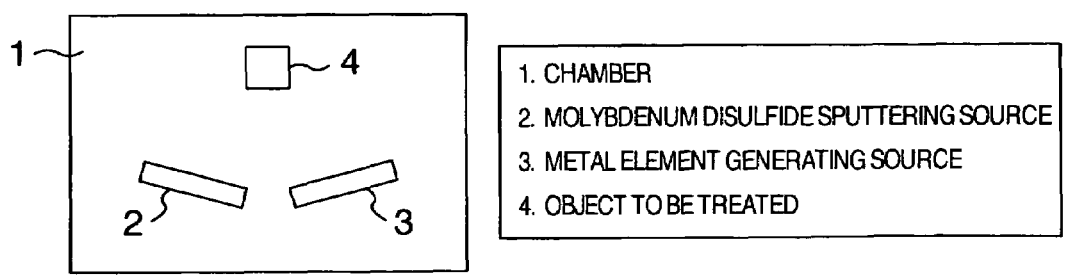
FIG. 2 is a schematic view illustrating one example of an apparatus for forming the lubricating layer of a multi-layer coating according to the present invention.
Figure 3:
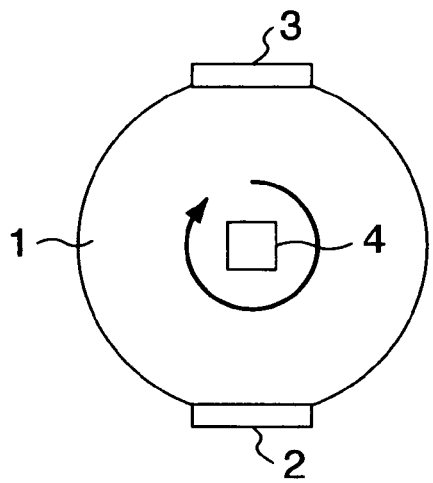
FIG. 3 is a schematic view illustrating another example of an apparatus for forming the lubricating layer of a multi-layer coating according to the present invention.

The positional relationship between the molybdenum disulfide sputtering source and the metal element generating source, which are in the same chamber, can be thought of as what is illustrated in FIGS. 2 and 3. FIG. 2 illustrates the case where the molybdenum disulfide sputtering source 2 and the metal element generating source 3 are provided on the same side facing the object to be treated, whereby forming with a continuous composition gradient is possible. FIG. 3 illustrates the case where the above 2 and 3 are provided facing each other across the center of the object to be treated, whereby the center of the object to be treated is rotated by a drive system, and thereby alternately irradiated from the above 2 and 3.

Figure 4:
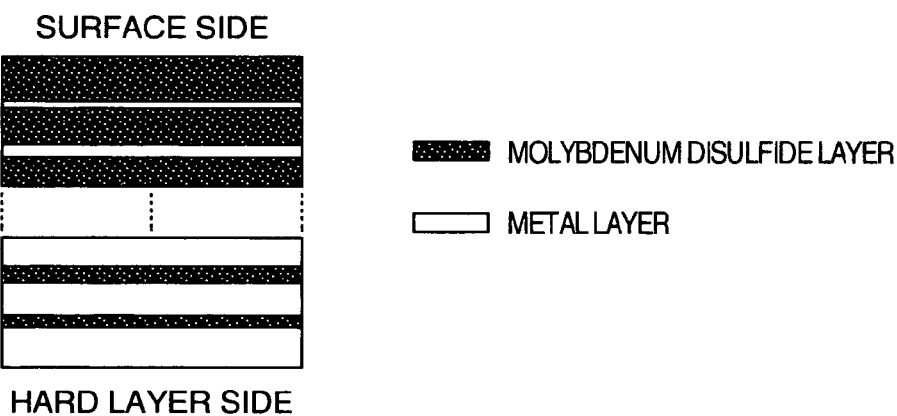
FIG. 4 is a cross-sectional schematic view illustrating one example of the structure of the lubricating layer of a multi-layer coating according to the present invention.

Strictly speaking, a lubricating layer formed in the manner illustrated in FIG. 3 does not have a continuous composition gradient, but can rather be thought of as a super-multilayered coating consisting of molybdenum disulfide layers and metal element layers, having a step-wise structure such as that illustrated in FIG. 4 in which the molybdenum disulfide layers and metal element layers are varied in their thickness as the laminated layers are repeated. However, because the interval between laminate layers is fine, it is difficult to detect that this is a stepped laminate layer even with GDS, so that as illustrated in FIG. 1, the composition is viewed as continuously varying. Nevertheless, even such a lubricating layer achieves the layer adhesion and sliding properties, and thereby satisfies the present invention.

The lubricating layer formed by sputtering is preferably deposited at 380° C. or less. If the temperature is greater than 380° C. there is a risk even in vacuum deposition that an oxidation reaction with the molybdenum disulfide will occur, whereby layer adhesion would deteriorate. No greater than 350° C. is further preferable. While there are no particular limits on the how low the temperature can be, if the deposition temperature is too low oxygen is more likely to remain in the layer, so that 200° C. or more is preferable. The range between 250° C. and 330° C. is more preferable.

Figure 5:
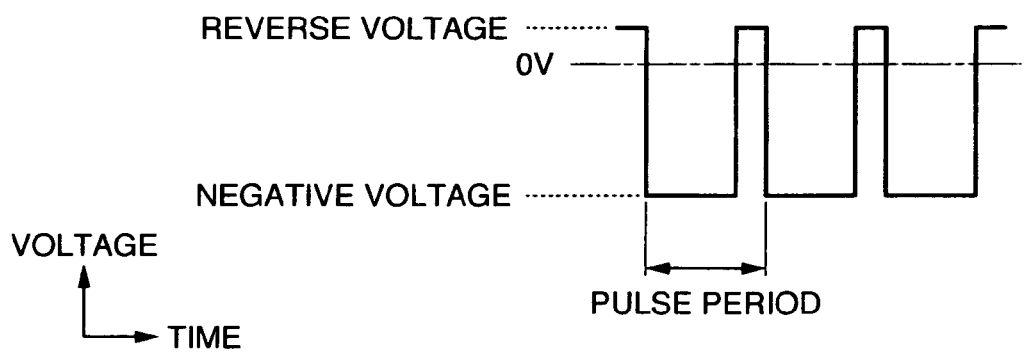
FIG. 5 is an applied voltage pattern for when the molybdenum disulfide contained in a lubricating layer of a multi-layer coating according to the present invention was sputtered.

Molybdenum disulfide has a higher electric resistance than metal, so that sputtering is employed in its layer fabrication. However, localized emission phenomenon (arcing) tends to occur on the target, whereby the problem exists that a uniform layer is hard to obtain. To avoid such arcing it is effective to suppress the applied power to a low level, although this in turn slows the deposition rate, which is industrially disadvantageous. Therefore, to not substantially lower the deposition rate and to avoid arcing, the method should periodically vary the direct voltage applied to the molybdenum disulfide sputtering source, as illustrated in FIG. 5. If performed in such a manner, arcing can be suppressed because immediately after a negative voltage is applied, the reverse voltage (positive voltage) is instantaneously applied.

However, since deposition of the layer substance does not occur while the reverse voltage is applied, the time period for reverse voltage is preferably extremely short. A preferable pulse shape has a reverse voltage applied time of from 5 μs to 20 μs, and the period is from 30 μs to 100 μs. Meanwhile, the reverse voltage value can be about that which can avoid arcing. If the voltage is too high, no further improvement in the effects can be expected, and yet the load placed on the power source becomes greater. For this reason, the value of the reverse voltage from the pulse is preferably between 0% and 30% of the absolute value of the negative voltage.

Sputtering includes methods such as high-frequency sputtering, magnetron sputtering and ion beam sputtering. Of these, magnetron sputtering is widely used, although in the deposition of the lubricating layer according to the present invention it is preferable to use an unbalanced magnetron sputtering method where the magnetic field has an unbalanced configuration. If an unbalanced magnetron sputtering method is used, the surface of the object to be treated is cleaned and activated from the effects of ion irradiation on the object, which is characteristic of unbalanced magnetron sputtering, thereby improving the lubricating layer adhesion.

Ion plating includes methods such as arc discharge, hollow cathode discharge and high-frequency excitation, by means of ionizing the target substance. All of these methods subject the target which will become the layer raw material to high energy, to thereby cause ionization of the target substance. From the perspective of the resulting impurity removal in the chamber, each of these methods achieves a sufficient effect. Among these methods, arc discharge, which has a high ionization rate, has the greatest effect, and is therefore preferable as the means for forming the layer according to the present invention.

EXAMPLE 1

High-speed tool steel SKH51 (cylindrical test piece: 8 mm diameter×100 mm length; plate shaped test piece: 3 mm thickness×10 mm width×30 mm length), which was modified through quenching and tempering to a hardness of 63 HRC, was used for the objects to be treated. The objects were mirror polished, and then well washed. Taking the procedure described below as a basis, the multi-layer coating shown in Table 1 were formed. The thickness of the formed multi-layer coating was measured from observation of the cross-section of the plate shaped test piece using an optical microscope or a scanning electron microscope (SEM). Analysis of the oxygen concentration in the coating thickness direction was carried out with a GDS (JY 5000RF, manufactured by Horiba Ltd.) using the plate shaped test piece. The analyzed region had a diameter of 4 mm, and was measured to a depth of at least the layer thickness of the lubricating layer.

TABLE 1

| | | Lubricating Layer | | | Atom %[*1] | | Gradient[*2] | |
|---|---|---|---|---|---|---|---|---|
| No. | Hard Layer | Composition (layer thickness μm) | | at. % O | 1 | 2 | 3 | 4 |
| 1 | CrN | Ti/MoS$_2$ | [0.7] | 17.9 | 80.1 | — | 63 | 213 |
| 2 | NbN | Ti/MoS$_2$ | [0.8] | 18.4 | 78.6 | — | 77 | 165 |
| 3 | Cr$_{0.95}$B$_{0.05}$N | Cr/MoS$_2$ | [0.9] | 19.3 | 77.0 | — | 36 | 310 |
| 4 | Ti$_{0.50}$Al$_{0.50}$N | Ti/MoS$_2$ | [0.8] | 18.1 | 83.3 | — | 45 | 220 |
| 5 | Ti$_{0.95}$B$_{0.05}$N | Ti/MoS$_2$ | [0.7] | 16.2 | 81.9 | — | 58 | 296 |
| 6 | VN | V/MoS$_2$ | [1.3] | 17.0 | 79.0 | — | 43 | 322 |
| 7 | Al$_{0.70}$Cr$_{0.30}$N | Ti/MoS$_2$ | [1.0] | 17.9 | 75.8 | — | 67 | 220 |
| 8 | Ti$_{0.75}$Si$_{0.25}$N | Ti/MoS$_2$ | [0.8] | 20.3 | 77.8 | — | 60 | 201 |
| 9 | CrN | Cr/MoS$_2$ | [0.9] | 17.6 | 74.9 | — | 66 | 203 |
| 10 | CrN | Ti/MoS$_2$ | [0.9] | 18.4 | 77.2 | 3.4 | 56 | 162 |
| 11 | ZrN | Zr/MoS$_2$ | [0.5] | 17.8 | 80.8 | 4.4 | 72 | 198 |
| 12 | Cr$_{0.92}$Si$_{0.03}$B$_{0.05}$N | Cr/MoS$_2$ | [3.0] | 22.4 | 81.2 | 2.3 | 59 | 225 |
| 13 | ZrN | Zr/MoS$_2$ | [0.9] | 19.8 | 55.5 | 1.0 | 14 | 142 |
| 14 | VN | Ti/MoS$_2$ | [0.8] | 17.3 | 79.7 | 15.8 | 18 | 185 |
| 15 | none | Ti/MoS$_2$ | [1.3] | 14.7 | 90.6 | 3.0 | 55 | 245 |
| 16 | TiN | Ti only | [1.2] | 9.8 | — | 98.3 | — | — |
| 17 | Al$_{0.70}$Cr$_{0.30}$N | MoS$_2$ only | [2.3] | 22.0 | — | — | — | — |
| 18 | TiCN | Ti/MoS$_2$ | [1.7] | 16.1 | 64.3 | 61.4 | 4 | 387 |
| 19 | TiN | Cr/MoS$_2$ | [1.9] | 29.4 | 72.7 | — | 61 | 220 |
| 20 | CrN | Ti/MoS$_2$ | [2.3] | 27.9 | 80.6 | — | 50 | 191 |
| 21 | TiCN | Cr/MoS$_2$ | [1.3] | 27.3 | 82.5 | 6.6 | 68 | 236 |
| 22 | TiN | Ti/MoS$_2$ | [1.0] | 25.5 | 88.2 | — | 44 | 165 |

| No. | Top surface Layer MoS$_2$ Presence (layer thickness μm) | Remark 1 | Remark 2 |
|---|---|---|---|
| 1 | yes [0.05] | | present invention |
| 2 | yes [0.05] | | present invention |
| 3 | yes [0.05] | | present invention |
| 4 | yes [0.05] | | present invention |
| 5 | yes [0.05] | | present invention |
| 6 | yes [0.10] | | present invention |
| 7 | yes [0.05] | | present invention |
| 8 | yes [0.15] | | present invention |
| 9 | yes [0.05] | | present invention |
| 10 | no | | present invention |
| 11 | no | a non-pulsed ordinary direct voltage was applied to the MoS$_2$ sputtering source | present invention |
| 12 | no | lubricating layer deposition temperature of 400° C. | present invention |
| 13 | no | | present invention |
| 14 | no | | present invention |
| 15 | no | | comparative example |
| 16 | no | | comparative example |
| 17 | — | | comparative example |
| 18 | no | | comparative example |
| 19 | yes [0.10] | | comparative example |
| 20 | yes [0.05] | composite PVD apparatus was not used | comparative example |
| 21 | no | hard layer deposition temperature of 350° C. | comparative example |
| 22 | yes [0.05] | hard layer was formed by sputtering | comparative example |

On the metal content curve of the lubricating layer region according to GDS analysis:
[*1] 1 content directly above the hard layer (point A in FIG. 1) 2 top surface content
[*2] 3 minimum value of the gradient taken between two points separated by a distance of 0.2 μm 4 maximum value of the gradient taken between two points separated by a distance of 0.05 μm Except for No. 20, for the coating depositions in Table 1 a composite PVD apparatus which had an arc discharge type ion plating source and two unbalanced magnetron sputtering sources was employed. These two sputtering sources were mounted with respectively a molybdenum disulfide target and a metal target. As illustrated in FIG. 3, these targets were provided so as to opposingly sandwich the object to be treated which was rotating around the chamber center at $(0.1\pi)$ rad/s. A heater was also provided on the chamber wall face of the apparatus, thereby enabling temperature control of the object to be treated.

The continuous coating process using the composite PVD apparatus was conducted by, except for a part that will be explained below, first heating the object to be treated in a high vacuum, then subjecting the heated object to plasma cleaning by Ar ions (bias voltage of between −200 V and −300 V), and if necessary again subjecting to plasma cleaning by metal ions (bias voltage of between −300 V and −600 V). The chamber interior was filled with a 3.0 Pa atmosphere of nitrogen gas or a mixed gas of nitrogen and methane, and a hard layer consisting of a nitride or a carbonitride was formed (bias voltage of between −50 V and −100 V) by ion plating. Deposition temperature was 450° C., and the coating time was adjusted so that the thickness of the hard layer was 2 µm. Of the hard layers shown in Table 1, the numbers written alongside the elements denote the ratio of atoms present (atom number ratio) in the target that was used for the ion plating.

Once the ion plating had finished, and while the object to be treated was still held in the chamber, plasma cleaning was again carried out with Ar ions, after which the sputtering source mounted with the metal target was activated. The voltage applied to the sputtering source at this stage was set at the limit at which arcing would not occur. Next, the sputtering source mounted with the molybdenum disulfide target was started up from 0 kW. The voltage applied at this stage was set to a direct current pulse voltage having a 40 µs period. The reverse voltage applied time was 10 µs, and the reverse voltage value was set at 10% of the absolute value of the negative voltage. Then, while slowly increasing the power applied to the molybdenum disulfide sputtering source, the power applied to the metal sputtering source was slowly decreased. Finally, deposition from only the molybdenum disulfide sputtering source was carried out as necessary for a few minutes, whereby coating was completed. The lubricating layer deposition temperature was 300° C.

The coating samples that had different steps from those described above will be now briefly explained below.

In No. 11, a non-pulsed, ordinary direct voltage was applied to the molybdenum disulfide sputtering source.

In No. 12, the lubricating layer deposition temperature was 400° C.

In Nos. 13 and 14, the metal element content directly above the hard layer, or that of the top surface, in the lubricating layer was adjusted by varying the output of the metal sputtering source.

In No. 15, a hard layer was not formed.

In No. 16, a molybdenum disulfide sputtering source was not used.

In No. 17, a metal sputtering source was not used during lubricating layer formation.

In No. 18, the metal element content was fixed at about 60 atom % in the lubricating layer.

In No. 19, a minute amount of oxygen gas was charged into the atmosphere during lubricating layer formation.

In No. 20, a composite PVD apparatus was not used at all. An arc discharge type ion plating apparatus and an unbalanced magnetron sputtering apparatus which had separate chambers were employed.

In No. 21, the hard layer deposition temperature was 350° C.

In No. 22, a sputtering source was used not only for the lubricating layer, but also for hard layer formation. The deposition conditions were a deposition temperature of 450° C., a bias voltage of −100 V and a nitrogen gas pressure of 0.8 Pa. The resulting hard layer thickness was 1.0 µm.

Evaluation of the seize resistance of the deposited coatings was conducted by a reciprocating frictional wear test using the cylindrical test piece. No external lubricating agent was supplied during the test, in which the test piece was pressed at a right angle with a fixed load against an identically shaped reciprocating piece S35C (150 to 160 HV). These pieces were slid in a reciprocating manner at a friction velocity of 0.83 m/s. The pressed load was increased by 98 N for every 13 m that the pieces were made to slide. Although this test was intended to check the load when seizing took place in the test pieces, factors for seizing occurrence include cases where the test piece surface strength is unable to withstand the load being pressed against it, thereby leading to breakage, and cases where the test piece contacting portion undergoes local melting due to the heat of friction generated by sliding. Either of these factors are detected as the occurrence of seizing. The maximum load for the present test machine was 2,940 N. The test results are shown in Table 2.

TABLE 2

| No. | Seize Occurrence Load (N) | Remarks |
|---|---|---|
| 1 | 2940 | present invention |
| 2 | 2550 | " |
| 3 | 2160 | " |
| 4 | 2750 | " |
| 5 | 2650 | " |
| 6 | 2350 | " |
| 7 | more than 2940 | " |
| 8 | 2350 | " |
| 9 | 2450 | " |
| 10 | 2350 | " |
| 11 | 2060 | " |
| 12 | 2050 | " |
| 13 | 2000 | " |
| 14 | 2000 | " |
| 15 | 880 | comparative example |
| 16 | 780 | " |
| 17 | 1570 | " |
| 18 | 1770 | " |
| 19 | 1270 | " |
| 20 | 1270 | " |
| 21 | 1000 | " |
| 22 | 1000 | " |

Nos. 1 to 14 were multi-layer coatings satisfying the present invention, which all achieved a high seize load of 1,960 N or more. Among these, No. 9, in which Cr was selected as the metal for incorporation into the lubricating layer compared with the Ti of No. 1, had a lower seize load than No. 1, whereby it was learned that mixing Ti into a lubricating layer is effective. Unlike No. 1, No. 10 was not formed with a molybdenum disulfide layer on its top surface. Its seize load was lower than that of No. 1, whereby the effectiveness of having a molybdenum disulfide layer was confirmed.

In No. 11, a non-pulsed ordinary direct voltage was applied to the molybdenum disulfide target, which caused the thickness of the lubricating layer to become thinner and thus have a lower seize load than that of the other coatings according to the present invention. In No. 12, lubricating layer deposition was carried out at 400° C. Since even in a vacuum a minute amount of molybdenum disulfide is oxidized at such a high temperature, the oxygen concentration in the lubricating layer rose, and lubricating layer adhesion fell. However, in No. 12, which had an oxygen concentration of no more than 25 atom %, a seize load of 1,960 N, which is enough for use as a sliding part, was achieved.

In No. 13, the metal element content directly above the hard layer in the lubricating layer was not within the preferable range according to the present invention. This meant that adhesion was poor, and that the seize load dropped. In No. 14, the metal element content of the top surface of the lubricating layer was not within the preferable range according to the present invention. This meant that the friction coefficient was high, and that the seize load dropped.

Meanwhile, in Nos. 15 to 22 the multi-layer coating according to the present invention was not achieved. In No. 15, a hard layer which would act as the underlayer was not formed in the multi-layer coating, so that seizing quickly occurred. If there is no hard layer present, early seizing easily occurs even if the lubricating layer is present, since the hard layer plays a major role in wear resistance.

In No. 16, a lubricating layer was not formed in the multi-layer coating. In this case, since the respective test pieces stuck together from the heat of friction generated by the sliding parts, even if a hard layer had been coated, seizing would occur at a low load. In No. 17, a metal element was not incorporated in the lubricating layer, whereby the adhesion with the hard layer serving as the underlayer was insufficient, and seizing occurred.

In No. 18, the metal element incorporated in the lubricating layer did not have a graded composition, the metal element (Ti) composition being fixed at 60 atom %. Accordingly, although the lubricating layer had excellent adhesion with the hard layer, seizing occurred even at a light load as the friction coefficient was high. In No. 19, oxygen gas was charged into the atmosphere, whereby the oxygen concentration in the lubricating layer exceeded 25 atom %. This meant that the lubricating layer was brittle, so that peeling took place even at a light load.

In No. 20, a composite PVD apparatus was not employed as the means for fabricating the layer according to the present invention. Instead, the layer was fabricated using a dedicated apparatus for both the arc discharge type ion plating and the unbalanced magnetron sputtering. As a result, the oxygen concentration in the lubricating layer was not within the values stipulated in the present invention, whereby sufficient lubricating properties could not be achieved.

In No. 21, the hard layer deposition was carried out at 350° C., whereby the oxygen concentration in the subsequently formed lubricating layer increased, adhesion worsened and the seize load decreased. In No. 22, because a sputtering source was used to form the hard layer, the oxygen impurities in the chamber could not be sufficiently removed, thereby affecting the subsequently formed lubricating layer quality, and a sufficient seize load could not be achieved.

EXAMPLE 2

In preparing the layers in Example 1, a number of punches machined from objects were provided. The punches were also coated under the same conditions, respectively, as the objects for Example 1. The material for punches was SKH 51 (hardness 63HRC). Using the coated punches, an actual machine test was carried out for room temperature working of the material to be worked (SUS 304 sheets). The maximum numbers of holes that could be punched were evaluated and the results are shown in Table 3.

TABLE 3

| No. | number of punching | Remarks |
| --- | --- | --- |
| 1 | 13,600 | present invention |
| 2 | 12,200 | " |
| 3 | 11,500 | " |
| 4 | 14,500 | " |
| 5 | 13,300 | " |
| 6 | 13,400 | " |
| 7 | 15,800 | " |
| 8 | 12,000 | " |
| 9 | 12,100 | " |
| 10 | 11,000 | " |
| 11 | 10,900 | " |
| 12 | 10,900 | " |
| 13 | 10,000 | " |
| 14 | 10,300 | " |
| 15 | 3,600 | comparative example |
| 16 | 5,000 | " |
| 17 | 8,200 | " |
| 18 | 8,700 | " |
| 19 | 6,900 | " |
| 20 | 6,300 | " |
| 21 | 7,100 | " |
| 22 | 5,500 | " |

From Table 3, it can be seen that in the example according to the present invention the Nos. 1 to 14 punches were all able to punch a number sufficient for practical use of 10,000 holes or more, thus generally reflecting the results of the reciprocating frictional wear test of Example 1.

In addition to use in environments ranging from hot to cold as a metal die or similar utilized in a punch employed in punching, or in pressing or forging, the present invention can also be applied on a hot die. Moreover, taking into consideration the fact that its multi-layer coating has excellent sliding properties, the present invention can also be applied, for example, on a cutting tool or the like.

The invention claimed is:

1. A multi-layer coating having excellent adhesion and sliding properties, which comprises a hard layer having a main component of a nitride and/or carbonitride of one or more elements selected from the group consisting of Ti, V, Zr, Cr, Nb, Si, Al and B and a lubricating layer consisting of a metal element and molybdenum disulfide on the hard layer wherein the lubricating layer has a graded composition in which the metal element has a decreasing content from the hard layer side towards the surface and the molybdenum disulfide has an increasing content, and wherein the lubricating layer has a maximum oxygen concentration of no greater than 25 atom % and a thickness of 0.5 μm or more.

2. The multi-layer coating having excellent adhesion and sliding properties according to claim 1, wherein the metal element for forming the lubricating layer is Ti.

3. The multi-layer coating having excellent adhesion and sliding properties according to claim 2, wherein the lubricating layer has a thickness of 3.0 μm or less.

4. The multi-layer coating having excellent adhesion and sliding properties according to claim 2, wherein the metal element content at an interface between the hard layer and the lubricating layer is at least 60 atom %.

5. The multi-layer coating having excellent adhesion and sliding properties according to claim 2, wherein a gradient between two points separated by a distance of 0.2 μm at any section of a metal content curve in the lubricating layer region is never less than 20.

6. The multi-layer coating having excellent adhesion and sliding properties according to claim 5, wherein the gradient between two points separated by a distance of 0.05 μm is never greater than 350.

7. The multi-layer coating having excellent adhesion and sliding properties according to claim 1, wherein a 0.01 mm or more thick molybdenum disulfide layer is formed on the top surface of the multi-layer coating.

8. The multi-layer coating having excellent adhesion and sliding properties according to claim 7, wherein the lubricating layer has a thickness of 3.0 μm or less.

9. The multi-layer coating having excellent adhesion and sliding properties according to claim 7, wherein the metal element content at an interface between the hard layer and the lubricating layer is at least 60 atom %.

10. The multi-layer coating having excellent adhesion and sliding properties according to claim 7, wherein a gradient between two points separated by a distance of 0.2 μm at any section of a metal content curve in the lubricating layer region is never less than 20.

11. The multi-layer coating having excellent adhesion and sliding properties according to claim 10, wherein the gradient between two points separated by a distance of 0.05 μm is never greater than 350.

12. The multi-layer coating having excellent adhesion and sliding properties according to claim 1, wherein the lubricating layer has a thickness of 3.0 μm or less.

13. The multi-layer coating having excellent adhesion and sliding properties according to claim 1, wherein the metal element content at an interface between the hard layer and the lubricating layer is at least 60 atom %.

14. The multi-layer coating having excellent adhesion and sliding properties according to claim 1, wherein a gradient between two points separated by a distance of 0.2 μm at any section of a metal content curve in the lubricating layer region is never less than 20.

15. The multi-layer coating having excellent adhesion and sliding properties according to claim 14, wherein the gradient between two points separated by a distance of 0.05 μm is never greater than 350.

16. A method for producing the multi-layer coating having excellent adhesion and sliding properties according to claim 1, wherein in forming the multi-layer coating, an ion plating source is used for forming the hard layer, a coating source is used for forming the lubricating layer, and at least the molybdenum disulfide contained therein is deposited using a sputtering source, the ion plating source and the coating source being provided in the same chamber, wherein an object held in the chamber, which is to have the multi-layer coating formed thereon, is provided with the hard layer formed at a temperature of 380° C. or more and subsequently the lubricating layer formed while the object is held in the chamber.

17. The method for producing the multi-layer coating having excellent adhesion and sliding properties according to claim 16, wherein the ion plating source is an arc discharge type.

18. The method for producing the multi-layer coating having excellent adhesion and sliding properties according to claim 16, wherein the lubricating layer is formed on the object when the temperature of the object is no greater than 380° C.

19. The method for producing the multi-layer coating having excellent adhesion and sliding properties according to claim 16, wherein the sputtering source for depositing molybdenum disulfide applies a direct current pulse voltage.

20. The method for producing the multi-layer coating having excellent adhesion and sliding properties according to claim 16, wherein the sputtering source for depositing molybdenum disulfide is an unbalanced magnetron sputtering source.

* * * * *